US009823576B2

(12) United States Patent
Smeets et al.

(10) Patent No.: US 9,823,576 B2
(45) Date of Patent: Nov. 21, 2017

(54) RADIATION MODULATOR FOR A LITHOGRAPHY APPARATUS, A LITHOGRAPHY APPARATUS, A METHOD OF MODULATING RADIATION FOR USE IN LITHOGRAPHY, AND A DEVICE MANUFACTURING METHOD

(71) Applicant: ASML NETHERLANDS B.V., Veldhoven (NL)

(72) Inventors: Dries Smeets, Hasselt (BE); Arno Jan Bleeker, Westerhoven (NL); Christopher James Lee, Enschede (NL); Pieter Willem Herman De Jager, Middelbeers (NL); Heine Melle Mulder, Veldhoven (NL); Rudy Jan Maria Pellens, Overpelt (BE)

(73) Assignee: ASML NETHERLANDS B.V., Veldhoven (NL)

( * ) Notice: Subject to any disclaimer, the term of this patent is extended or adjusted under 35 U.S.C. 154(b) by 326 days.

(21) Appl. No.: 14/165,334

(22) Filed: Jan. 27, 2014

(65) Prior Publication Data
US 2014/0211189 A1 Jul. 31, 2014

Related U.S. Application Data

(60) Provisional application No. 61/758,184, filed on Jan. 29, 2013.

(51) Int. Cl.
G03B 27/72 (2006.01)
G03F 7/20 (2006.01)
(52) U.S. Cl.
CPC ...... *G03F 7/70191* (2013.01); *G03F 7/70291* (2013.01)

(58) Field of Classification Search
CPC ... G03F 7/70191; G03F 7/70291; G02F 1/011
See application file for complete search history.

(56) References Cited

U.S. PATENT DOCUMENTS 4,090,206 A 5/1978 Pfeifer
4,447,126 A 5/1984 Heidrich
(Continued)

FOREIGN PATENT DOCUMENTS

DE 4315580 11/1994
DE 4315581 11/1994
(Continued)

OTHER PUBLICATIONS

Pieter Willem Herman De Jager et al., U.S. Appl. No. 61/473,636, filed Apr. 8, 2011.
(Continued)

*Primary Examiner* — Deoram Persaud
(74) *Attorney, Agent, or Firm* — Pillsbury Winthrop Shaw Pittman LLP

(57) ABSTRACT

A radiation modulator for a lithography apparatus, a lithography apparatus, a method of modulating radiation for use in lithography, and a device manufacturing method is disclosed. The radiation modulator for a lithography apparatus may have a plurality of waveguides supporting propagation therethough of radiation having a wavelength less than 450 nm; and a modulating section configured to individually modulate radiation propagating in each of the waveguides in order to provide a modulated plurality of output beams.

21 Claims, 9 Drawing Sheets

(56) References Cited

U.S. PATENT DOCUMENTS

| | | | |
|---|---|---|---|
| 4,520,472 A | 5/1985 | Reno | |
| 4,525,729 A | 6/1985 | Agulnek | |
| 4,640,573 A | 2/1987 | Kataoka | |
| 4,780,730 A | 10/1988 | Dodge | |
| 4,796,038 A | 1/1989 | Allen | |
| 4,844,568 A | 7/1989 | Suzuki | |
| 4,864,216 A | 9/1989 | Kalata | |
| 4,952,949 A | 8/1990 | Uebbing | |
| 5,051,762 A | 9/1991 | Lea | |
| 5,216,247 A | 6/1993 | Wang | |
| 5,216,534 A | 6/1993 | Boardman | |
| 5,229,872 A | 7/1993 | Mumola | |
| 5,296,891 A | 3/1994 | Vogt | |
| 5,457,488 A | 10/1995 | Nakamura | |
| 5,481,392 A | 1/1996 | Damer | |
| 5,523,193 A | 6/1996 | Nelson | |
| 5,568,320 A | 10/1996 | Rees | |
| 5,589,973 A | 12/1996 | King | |
| 5,610,754 A | 3/1997 | Gheen | |
| 5,621,498 A * | 4/1997 | Inoue | G03F 7/70066 355/53 |
| 5,668,587 A | 9/1997 | Hammond | |
| 5,705,788 A | 1/1998 | Beyer | |
| 5,838,024 A | 11/1998 | Masuda | |
| 5,840,451 A | 11/1998 | Moore | |
| 6,037,965 A | 3/2000 | Gross | |
| 6,133,986 A | 10/2000 | Johnson | |
| 6,204,875 B1 | 3/2001 | De Loor | |
| 6,233,039 B1 | 5/2001 | Yen et al. | |
| 6,268,613 B1 | 7/2001 | Cantu | |
| 6,310,710 B1 | 10/2001 | Shahar | |
| 6,313,862 B1 | 11/2001 | Berner | |
| 6,466,352 B1 | 10/2002 | Shahar | |
| 6,531,681 B1 | 3/2003 | Markle | |
| 6,559,438 B1 | 5/2003 | Drobot | |
| 6,683,727 B1 | 1/2004 | Goring | |
| 6,765,647 B1 | 7/2004 | Nishi | |
| 6,795,169 B2 | 9/2004 | Tanaka | |
| 6,967,711 B2 | 11/2005 | Gui | |
| 7,116,402 B2 | 10/2006 | Gui | |
| 7,969,636 B2 | 6/2011 | Naito | |
| 2002/0115021 A1 | 8/2002 | Piao | |
| 2002/0126479 A1 | 9/2002 | Zhai | |
| 2002/0171047 A1 | 11/2002 | Chan | |
| 2003/0043582 A1 | 3/2003 | Chan | |
| 2003/0091277 A1 | 5/2003 | Mei | |
| 2004/0124372 A1 | 7/2004 | Gil | |
| 2004/0135159 A1 | 7/2004 | Siegel | |
| 2004/0135983 A1* | 7/2004 | Wieland | B82Y 10/00 355/67 |
| 2004/0170351 A1 | 9/2004 | Fishman et al. | |
| 2004/0257629 A1 | 12/2004 | Noehte | |
| 2005/0167508 A1 | 8/2005 | Syms | |
| 2005/0270514 A1* | 12/2005 | Hahn | G03F 7/70291 355/67 |
| 2006/0001855 A1 | 1/2006 | Lof | |
| 2006/0103719 A1 | 5/2006 | Katzir | |
| 2006/0108508 A1 | 5/2006 | Khalid | |
| 2006/0134535 A1* | 6/2006 | Porque | 430/30 |
| 2007/0034890 A1 | 2/2007 | Daschner | |
| 2007/0125969 A1* | 6/2007 | Schellenberg | B82Y 10/00 250/504 R |
| 2007/0182808 A1 | 8/2007 | Stiblert | |
| 2007/0296936 A1 | 12/2007 | Kato | |
| 2008/0014534 A1 | 1/2008 | Barwicz et al. | |
| 2008/0042969 A1 | 2/2008 | Baker | |
| 2008/0047445 A1 | 2/2008 | Berner | |
| 2008/0137051 A1 | 6/2008 | Maly | |
| 2008/0160211 A1 | 7/2008 | Siegel | |
| 2008/0210888 A1 | 9/2008 | Inoue | |
| 2009/0296063 A1 | 12/2009 | Opower | |
| 2010/0142757 A1 | 6/2010 | Sandstrom | |
| 2010/0265557 A1 | 10/2010 | Sallander | |
| 2011/0051211 A1 | 3/2011 | Walther | |
| 2011/0188016 A1 | 8/2011 | De Jager | |
| 2012/0182535 A1* | 7/2012 | Okazaki | G02F 1/2955 355/67 |

FOREIGN PATENT DOCUMENTS

| | | |
|---|---|---|
| DE | 19813127 | 10/1998 |
| EP | 1 835 347 | 9/2007 |
| JP | 57-152273 | 9/1982 |
| JP | 06-275936 | 9/1994 |
| JP | 2003-220484 | 8/2003 |
| WO | 97/34171 | 9/1997 |
| WO | 98/33096 | 7/1998 |
| WO | 98/38597 | 9/1998 |
| WO | 2005/006082 | 1/2005 |
| WO | 2006/002668 | 1/2006 |
| WO | 2006/064363 | 6/2006 |
| WO | 2007/050022 | 5/2007 |
| WO | 2007/050023 | 5/2007 |
| WO | 2007/098935 | 9/2007 |
| WO | 2008/071347 | 6/2008 |
| WO | 2010/032224 | 3/2010 |
| WO | 2010/151123 | 12/2010 |
| WO | 2011/026610 | 3/2011 |

OTHER PUBLICATIONS

Pieter Willem Herman De Jager et al., U.S. Appl. No. 61/524,190, filed Aug. 16, 2011.

LOT-Oriel Group Europe, "MicroWriter™ Laser Lithography System," www.LOT-Oriel.com (2 pp, date unknown, obtained Jul. 2010).

"Large-Plate Exposure System FX-63S," Nikon Web Magazine: Nikon Technology Outlook, Sep. 24, 2004, pp. 1-4.

JetScreen DX Flat Brochure (6 pp., date unknown, obtained Feb. 2009).

"Lithographic Apparatus and Device Manufacturing Method," Research Disclosure, Mason Publications, Hampshire, GB, vol. 551, No. 29, Mar. 1, 2010, p. 322, XP007139689, ISSN: 0374-4353.

S. Mias et al., "A review of active optical devices: I. Amplitude modulation," J. Micromech. Microeng., vol. 18, pp. 1-24 (2008).

S. Mias et al., "A review of active optical devices: II. Phase modulation," J. Micromech. Microeng., vol. 18, pp. 1-22 (2008).

\* cited by examiner

RADIATION MODULATOR FOR A LITHOGRAPHY APPARATUS, A LITHOGRAPHY APPARATUS, A METHOD OF MODULATING RADIATION FOR USE IN LITHOGRAPHY, AND A DEVICE MANUFACTURING METHOD

This application claims the benefit of priority from U.S. Provisional Patent Application Ser. No. 61/758,184, filed on Jan. 29, 2013, the contents of which is incorporated herein by reference in its entirety.

FIELD

The present invention relates to a radiation modulator for a lithography apparatus, a lithography apparatus, a method of modulating radiation for use in lithography, and a device manufacturing method.

BACKGROUND

A lithographic or exposure apparatus is a machine that applies a desired pattern onto a substrate or part of a substrate. A lithographic or exposure apparatus may be used, for example, in the manufacture of integrated circuits (ICs), flat panel displays and other devices or structures having fine features. In a conventional lithographic or exposure apparatus, a patterning device, which may be referred to as a mask or a reticle, may be used to generate a circuit pattern corresponding to an individual layer of the IC, flat panel display, or other device). This pattern may transferred on (part of) the substrate (e.g. silicon wafer or a glass plate), e.g. via imaging onto a layer of radiation-sensitive material (resist) provided on the substrate.

Instead of a circuit pattern, the patterning device may be used to generate other patterns, for example a color filter pattern, or a matrix of dots. Instead of a conventional mask, the patterning device may comprise a patterning array that comprises an array of individually controllable elements that generate the circuit or other applicable pattern. An advantage of such a "maskless" system compared to a conventional mask-based system is that the pattern can be provided and/or changed more quickly and for less cost.

Thus, a maskless system includes a programmable patterning device (e.g., a spatial light modulator, a contrast device, etc.). The programmable patterning device is programmed (e.g., electronically or optically) to form the desired patterned beam using the array of individually controllable elements. Types of programmable patterning devices include micro-mirror arrays, liquid crystal display (LCD) arrays, grating light valve arrays, arrays of self-emissive contrast devices, a shutter element/matrix and the like. A programmable patterning device could also be formed from an electro-optical deflector, configured for example to move spots of radiation projected onto the substrate or to intermittently direct a radiation beam away from the substrate, for example to a radiation beam absorber. In either such arrangement, the radiation beam may be continuous.

SUMMARY

Where self-emissive contrast devices comprising laser diodes are used, the diodes may be driven substantially constantly at an output level that is above the lasing threshold during an exposure process. Maintaining the diodes above the lasing threshold facilitates fast and accurate switching between different output levels. The radiation emitted when the laser diodes are driven at the threshold level (their lowest level) may result in a background exposure dose. The background exposure dose may be detrimental for imaging quality, particularly where the background exposure dose is inhomogeneous.

A large number of laser diodes may be required to provide a desired level of resolution. Installing and aligning a large number of diodes may be time consuming. A large number of diodes may increase the rate of diode failure. Frequent switching of a laser diode between different output levels may reduce the lifetime of the diode, thereby increasing the rate of diode replacement further.

It is desirable, for example, to address at least one of the problems mentioned above and/or other problems in the art.

According to an embodiment, there is provided a radiation modulator for a lithography apparatus, the radiation modulator comprising: a plurality of waveguides supporting propagation therethrough of radiation having a wavelength less than 450 nm; and a modulating section configured to individually modulate radiation propagating in each of the waveguides in order to provide a modulated plurality of output beams.

According to an embodiment, there is provided a lithography apparatus, comprising: a programmable patterning device configured to provide a plurality of individually controllable radiation beams, the programmable patterning device comprising a radiation modulator, the radiation modulator comprising a plurality of waveguides and a modulating section configured to individually modulate radiation propagating in each of the waveguides in order to provide the plurality of individually controllable radiation beams; and a projection system configured to project each of the radiation beams onto a respective location on a target.

According to an embodiment, there is provided a method of modulating radiation for use in lithography, the method comprising: providing a plurality of waveguides for supporting propagation therethrough of radiation having a wavelength less than 450 nm; and individually modulating radiation in each of the waveguides in order to provide a modulated plurality of output beams.

According to an embodiment, there is provided a device manufacturing method, comprising: providing a plurality of waveguides; individually modulating radiation propagating in each of the waveguides in order to provide a plurality of individually controllable radiation beams; and projecting each of the radiation beams onto a respective location on a target.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

An embodiment of the present invention relates to an apparatus that may include a programmable patterning device that may, for example, be comprised of an array or arrays of self-emissive contrast devices. Further information regarding such an apparatus may be found in PCT patent application publication no. WO 2010/032224 A2, U.S. patent application publication no. US 2011-0188016, U.S. patent application No. 61/473,636 and U.S. patent application No. 61/524,190 which are hereby incorporated by reference in their entireties. An embodiment of the present invention, however, may be used with any form of programmable patterning device including, for example, those discussed above.

Figure 1:
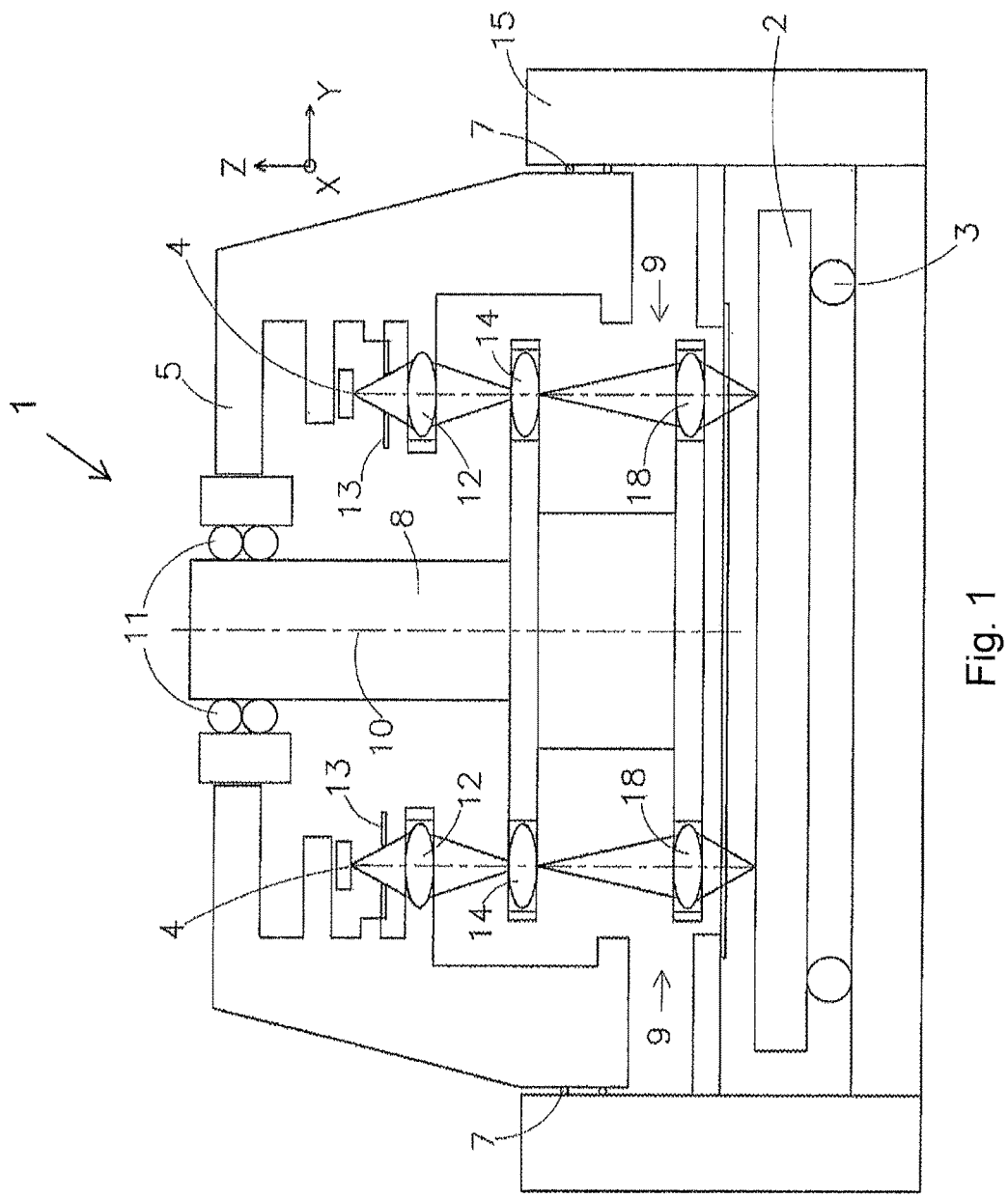
FIG. 1 depicts a part of a lithographic apparatus according to an embodiment of the invention.

FIG. 1 schematically depicts a schematic cross-sectional side view of a part of a lithographic or exposure apparatus. In this embodiment, the apparatus has individually controllable elements substantially stationary in the X-Y plane as discussed further below although it need not be the case. The apparatus 1 comprises a substrate table 2 to hold a substrate, and a positioning device 3 to move the substrate table 2 in up to 6 degrees of freedom. The substrate may be a resist-coated substrate. In an embodiment, the substrate is a wafer. In an embodiment, the substrate is a polygonal (e.g. rectangular) substrate. In an embodiment, the substrate is a glass plate. In an embodiment, the substrate is a plastic substrate. In an embodiment, the substrate is a foil. In an embodiment, the apparatus is suitable for roll-to-roll manufacturing.

The apparatus 1 further comprises a plurality of individually controllable self-emissive contrast devices 4 configured to emit a plurality of beams. In an embodiment, the self-emissive contrast device 4 is a radiation emitting diode, such as a light emitting diode (LED), an organic LED (OLED), a polymer LED (PLED), or a laser diode (e.g., a solid state laser diode). In an embodiment, each of the individually controllable elements 4 is a blue-violet laser diode (e.g., Sanyo model no. DL-3146-151). Such diodes may be supplied by companies such as Sanyo, Nichia, Osram, and Nitride. In an embodiment, the diode emits UV radiation, e.g., having a wavelength of about 365 nm or about 405 nm. In an embodiment, the diode can provide an output power selected from the range of 0.5-200 mW. In an embodiment, the size of laser diode (naked die) is selected from the range of 100-800 micrometers. In an embodiment, the laser diode has an emission area selected from the range of 0.5-5 micrometers$^2$. In an embodiment, the laser diode has a divergence angle selected from the range of 5-44 degrees. In an embodiment, the diodes have a configuration (e.g., emission area, divergence angle, output power, etc.) to provide a total brightness more than or equal to about $6.4 \times 10^8$ W/(m$^2$·sr).

Figure 2:
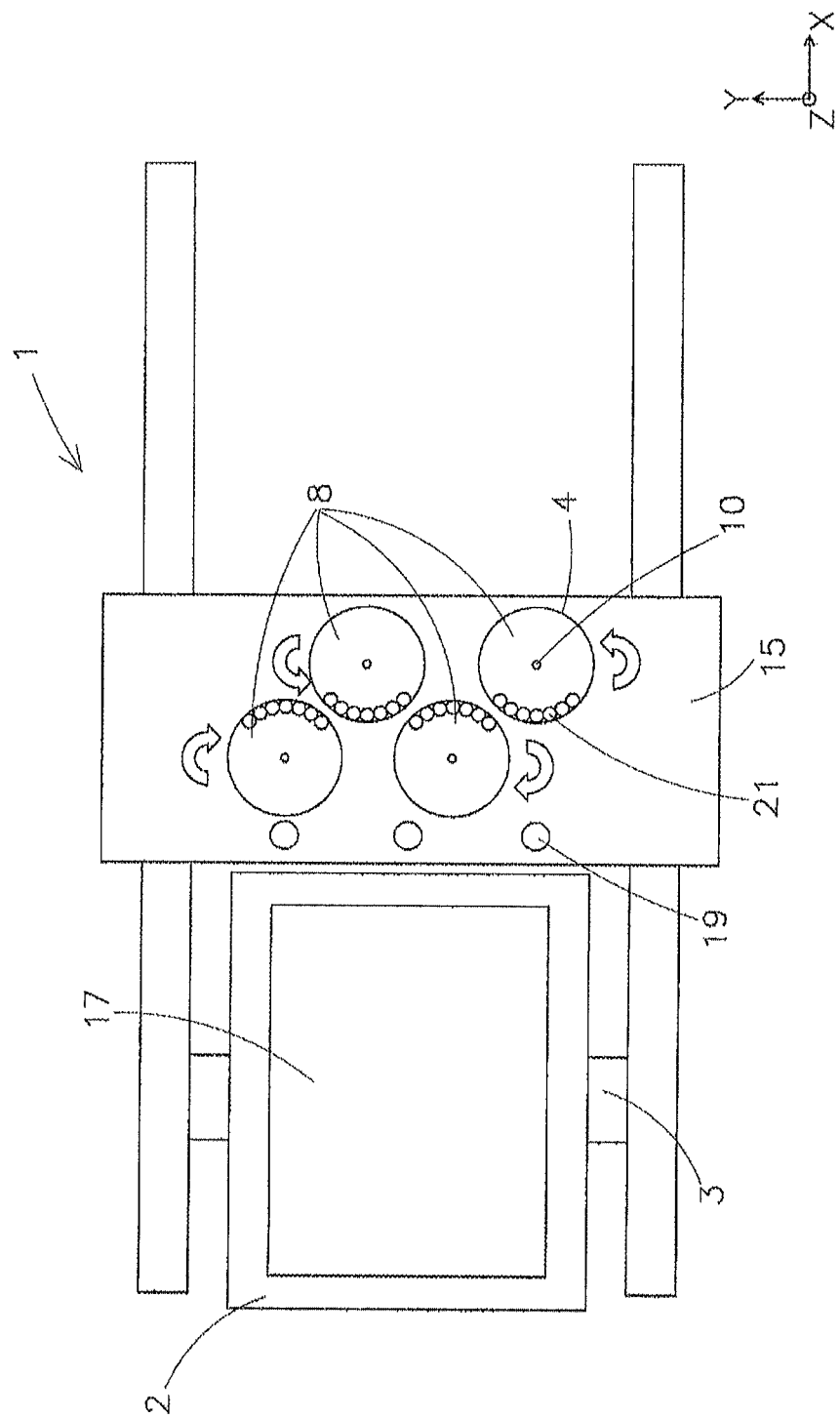
FIG. 2 depicts a top view of a part of the lithographic apparatus of FIG. 1 according to an embodiment of the invention.

The self-emissive contrast devices 4 are arranged on a frame 5 and may extend along the Y-direction and/or the X direction. While one frame 5 is shown, the apparatus may have a plurality of frames 5 as shown in FIG. 2. Further arranged on the frame 5 is lens 12. Frame 5 and thus self-emissive contrast device 4 and lens 12 are substantially stationary in the X-Y plane. Frame 5, self-emissive contrast device 4 and lens 12 may be moved in the Z-direction by actuator 7. Alternatively or additionally, lens 12 may be moved in the Z-direction by an actuator related to this particular lens. Optionally, each lens 12 may be provided with an actuator.

The self-emissive contrast device 4 may be configured to emit a beam and the projection system 12, 14 and 18 may be configured to project the beam onto a target portion of the substrate. The self-emissive contrast device 4 and the projection system form an optical column. The apparatus 1 may comprise an actuator (e.g. motor 11) to move the optical column or a part thereof with respect to the substrate. Frame 8 with arranged thereon field lens 14 and imaging lens 18 may be rotatable with the actuator. A combination of field lens 14 and imaging lens 18 forms movable optics 9. In use, the frame 8 rotates about its own axis 10, for example, in the directions shown by the arrows in FIG. 2. The frame 8 is rotated about the axis 10 using an actuator e.g. motor 11. Further, the frame 8 may be moved in a Z direction by motor 7 so that the movable optics 9 may be displaced relative to the substrate table 2.

An aperture structure 13 having an aperture therein may be located above lens 12 between the lens 12 and the self-emissive contrast device 4. The aperture structure 13 can limit diffraction effects of the lens 12, the associated self-emissive contrast device 4, and/or of an adjacent lens 12/self-emissive contrast device 4.

The depicted apparatus may be used by rotating the frame 8 and simultaneously moving the substrate on the substrate table 2 underneath the optical column. The self-emissive contrast device 4 can emit a beam through the lenses 12, 14, and 18 when the lenses are substantially aligned with each other. By moving the lenses 14 and 18, the image of the beam on the substrate is scanned over a portion of the substrate. By simultaneously moving the substrate on the substrate table 2 underneath the optical column, the portion of the substrate which is subjected to an image of the self-emissive contrast device 4 is also moving. By switching the self-emissive contrast device 4 "on" and "off" (e.g., having no output or output below a threshold when it is "off" and having an output above a threshold when it is "on") at high speed under control of a controller, controlling the rotation of the optical column or part thereof, controlling the intensity of the self-emissive contrast device 4, and controlling the speed of the substrate, a desired pattern can be imaged in the resist layer on the substrate.

FIG. 2 depicts a schematic top view of the apparatus of FIG. 1 having self-emissive contrast devices 4. Like the apparatus 1 shown in FIG. 1, the apparatus 1 comprises a substrate table 2 to hold a substrate 17, a positioning device 3 to move the substrate table 2 in up to 6 degrees of freedom, an alignment/level sensor 19 to determine alignment between the self-emissive contrast device 4 and the substrate 17, and to determine whether the substrate 17 is at level with respect to the projection of the self-emissive contrast device 4. As depicted the substrate 17 has a rectangular shape, however also or alternatively round substrates may be processed.

The self-emissive contrast device 4 is arranged on a frame 15. The self-emissive contrast device 4 may be a radiation emitting diode, e.g., a laser diode, for instance a blue-violet laser diode. As shown in FIG. 2, the self-emissive contrast devices 4 may be arranged into an array 21 extending in the X-Y plane.

The array 21 may be an elongate line. In an embodiment, the array 21 may be a single dimensional array of self-emissive contrast devices 4. In an embodiment, the array 21 may be a two dimensional array of self-emissive contrast device 4.

A rotating frame 8 may be provided which may be rotating in a direction depicted by the arrow. The rotating frame may be provided with lenses 14, 18 (show in FIG. 1) to provide an image of each of the self-emissive contrast devices 4. The apparatus may be provided with an actuator to rotate the optical column comprising the frame 8 and the lenses 14, 18 with respect to the substrate.

Figure 3:
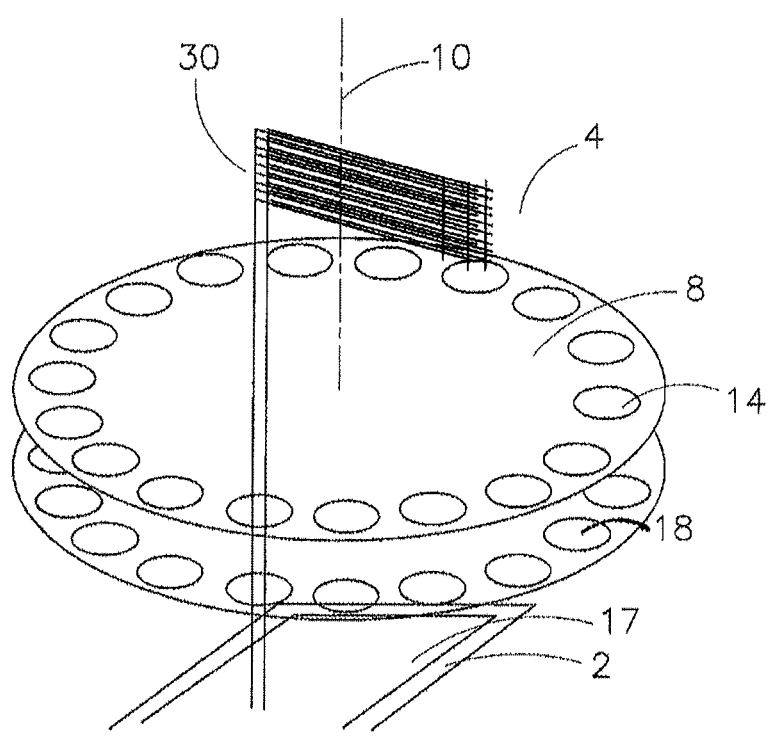
FIG. 3 depicts a highly schematic, perspective view of a part of a lithographic apparatus according to an embodiment of the invention.

FIG. 3 depicts a highly schematic, perspective view of the rotating frame 8 provided with lenses 14, 18 at its perimeter. A plurality of beams, in this example 10 beams, are incident onto one of the lenses and projected onto a target portion of the substrate 17 held by the substrate table 2. In an embodiment, the plurality of beams are arranged in a straight line. The rotatable frame is rotatable about axis 10 by means of an actuator (not shown). As a result of the rotation of the rotatable frame 8, the beams will be incident on successive lenses 14, 18 (field lens 14 and imaging lens 18) and will, incident on each successive lens, be deflected thereby so as to travel along a part of the surface of the substrate 17, as will be explained in more detail with reference to FIG. 4. In an embodiment, each beam is generated by a respective source, i.e. a self-emissive contrast device, e.g. a laser diode (not shown in FIG. 3). In the arrangement depicted in FIG. 3, the beams are deflected and brought together by a segmented mirror 30 in order to reduce a distance between the beams, to thereby enable a larger number of beams to be projected through the same lens and to achieve resolution requirements to be discussed below.

Figure 4:
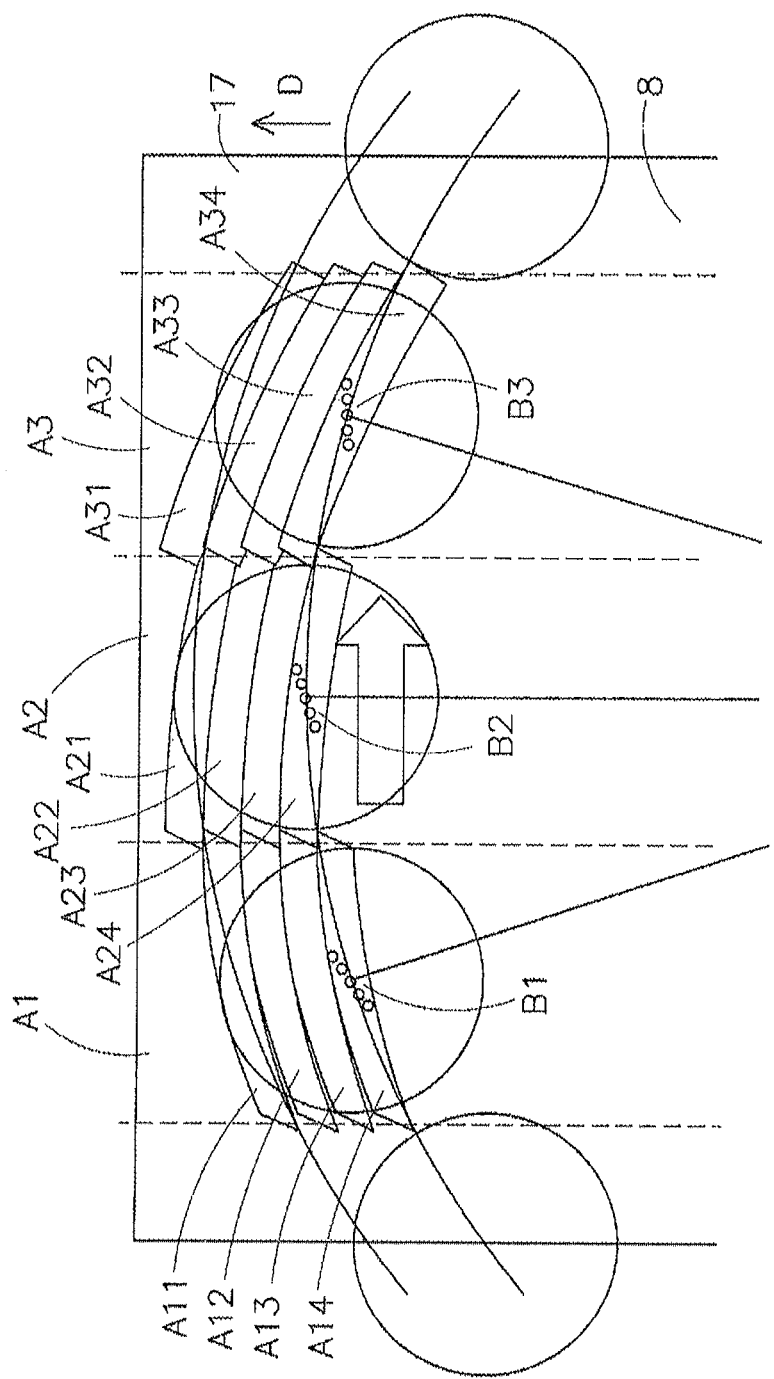
FIG. 4 depicts a schematic top view of projections by the lithographic apparatus according to FIG. 3 onto a substrate according to an embodiment of the invention.

As the rotatable frame rotates, the beams are incident on successive lenses and, each time a lens is irradiated by the beams, the places where the beam is incident on a surface of the lens, moves. Since the beams are projected on the substrate differently (with e.g. a different deflection) depending on the place of incidence of the beams on the lens, the beams (when reaching the substrate) will make a scanning movement with each passage of a following lens. This principle is further explained with reference to FIG. 4. FIG. 4 depicts a highly schematic top view of a part of the rotatable frame 8. A first set of beams is denoted by B1, a second set of beams is denoted by B2 and a third set of beams is denoted by B3. Each set of beams is projected through a respective lens set 14, 18 of the rotatable frame 8. As the rotatable frame 8 rotates, the beams B1 are projected onto the substrate 17 in a scanning movement, thereby scanning area A14. Similarly, beams B2 scan area A24 and beams B3 scan area A34. At the same time of the rotation of the rotatable frame 8 by a corresponding actuator, the substrate 17 and substrate table are moved in the direction D, which may be along the X axis as depicted in FIG. 2), thereby being substantially perpendicular to the scanning direction of the beams in the area's A14, A24, A34. As a result of the movement in direction D by a second actuator (e.g. a movement of the substrate table by a corresponding substrate table motor), successive scans of the beams when being projected by successive lenses of the rotatable frame 8, are projected so as to substantially abut each other, resulting in substantially abutting areas A11, A12, A13, A14 (areas A11, A12, A13 being previously scanned and A14 being currently scanned as shown in FIG. 4) for each successive scan of beams B1, areas A21, A22, A23 and A24 (areas A21, A22, A23 being previously scanned and A24 being currently scanned as shown in FIG. 4) for beams B2 and areas A31, A32, A33 and A34 (areas A31, A32, A33 being previously scanned and A34 being currently scanned as shown in FIG. 4) for beams B3. Thereby, the areas A1, A2 and A3 of the substrate surface may be covered with a movement of the substrate in the direction D while rotating the rotatable frame 8. The projecting of multiple beams through a same lens allows processing of a whole substrate in a shorter timeframe (at a same rotating speed of the rotatable frame 8), since for each passing of a lens, a plurality of beams scan the substrate with each lens, thereby allowing increased displacement in the direction D for successive scans. Viewed differently, for a given processing time, the rotating speed of the rotatable frame may be reduced when multiple beams are projected onto the substrate via a same lens, thereby possibly reducing effects such as deformation of the rotatable frame, wear, vibrations, turbulence, etc. due to high rotating speed. In an embodiment, the plurality of beams are arranged at an angle to the tangent of the rotation of the lenses 14, 18 as shown in FIG. 4. In an embodiment, the plurality of beams are arranged such that each beam overlaps or abuts a scanning path of an adjacent beam.

A further effect of the aspect that multiple beams are projected at a time by the same lens, may be found in relaxation of tolerances. Due to tolerances of the lenses (positioning, optical projection, etc), positions of successive areas A11, A12, A13, A14 (and/or of areas A21, A22, A23 and A24 and/or of areas A31, A32, A33 and A34) may show some degree of positioning inaccuracy in respect of each other. Therefore, some degree of overlap between successive areas A11, A12, A13, A14 may be required. In case of for example 10% of one beam as overlap, a processing speed would thereby be reduced by a same factor of 10% in case of a single beam at a time through a same lens. In a situation where there are 5 or more beams projected through a same lens at a time, the same overlap of 10% (similarly referring to one beam example above) would be provided for every 5 or more projected lines, hence reducing a total overlap by a factor of approximately 5 or more to 2% or less, thereby having a significantly lower effect on overall processing speed. Similarly, projecting at least 10 beams may reduce a total overlap by approximately a factor of 10. Thus, effects of tolerances on processing time of a substrate may be reduced by the feature that multiple beams are projected at a time by the same lens. In addition or alternatively, more overlap (hence a larger tolerance band) may be allowed, as the effects thereof on processing are low given that multiple beams are projected at a time by the same lens.

Alternatively or in addition to projecting multiple beams via a same lens at a time, interlacing techniques could be used, which however may require a comparably more stringent matching between the lenses. Thus, the at least two beams projected onto the substrate at a time via the same one of the lenses have a mutual spacing, and the apparatus may be arranged to operate the second actuator so as to move the substrate with respect to the optical column to have a following projection of the beam to be projected in the spacing.

In order to reduce a distance between successive beams in a group in the direction D (thereby e.g. achieving a higher resolution in the direction D), the beams may be arranged diagonally in respect of each other, in respect of the direction D. The spacing may be further reduced by providing a segmented mirror 30 in the optical path, each segment to reflect a respective one of the beams, the segments being arranged so as to reduce a spacing between the beams as reflected by the mirrors in respect of a spacing between the beams as incident on the mirrors. Such effect may also be achieved by a plurality of optical fibers, each of the beams being incident on a respective one of the fibers, the fibers being arranged so as to reduce along an optical path a spacing between the beams downstream of the optical fibers in respect of a spacing between the beams upstream of the optical fibers.

Further, such effect may be achieved using an integrated optical waveguide circuit having a plurality of inputs, each for receiving a respective one of the beams. The integrated optical waveguide circuit is arranged so as to reduce along an optical path a spacing between the beams downstream of the integrated optical waveguide circuit in respect of a spacing between the beams upstream of the integrated optical waveguide circuit.

A system may be provided for controlling the focus of an image projected onto a substrate. The arrangement may be provided to adjust the focus of the image projected by part or all of an optical column in an arrangement as discussed above.

In an embodiment the projection system projects the at least one radiation beam onto a substrate formed from a layer of material above the substrate 17 on which a device is to be formed so as to cause local deposition of droplets of the material (e.g. metal) by a laser induced material transfer.

Figure 5:
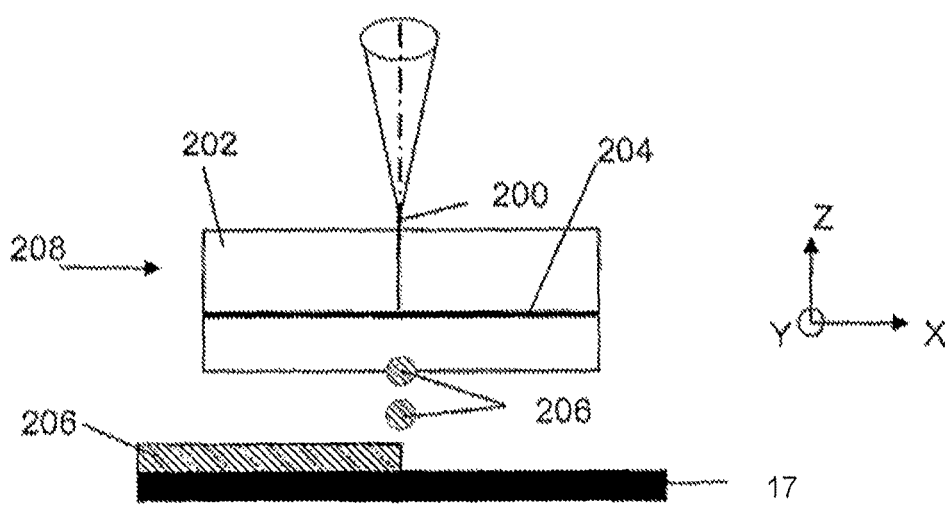
FIG. 5 depicts in cross-section, a part of an embodiment of the invention.

Referring to FIG. 5, the physical mechanism of laser induced material transfer is depicted. In an embodiment, a radiation beam 200 is focused through a substantially transparent material 202 (e.g., glass) at an intensity below the plasma breakdown of the material 202. Surface heat absorption occurs on a substrate formed from a donor material layer 204 (e.g., a metal film) overlying the material 202. The heat absorption causes melting of the donor material 204. Further, the heating causes an induced pressure gradient in a forward direction leading to forward acceleration of a donor material droplet 206 from the donor material layer 204 and thus from the donor structure (e.g., plate) 208. Thus, the donor material droplet 206 is released from the donor material layer 204 and is moved (with or without the aid of gravity) toward and onto the substrate 17 on which a device is to be formed. By pointing the beam 200 on the appropriate position on the donor plate 208, a donor material pattern can be deposited on the substrate 17. In an embodiment, the beam is focused on the donor material layer 204.

In an embodiment, one or more short pulses are used to cause the transfer of the donor material. In an embodiment, the pulses may be a few picoseconds or femto-seconds long to obtain quasi one dimensional forward heat and mass transfer of molten material. Such short pulses facilitate little to no lateral heat flow in the material layer 204 and thus little or no thermal load on the donor structure 208. The short pulses enable rapid melting and forward acceleration of the material (e.g., vaporized material, such as metal, would lose its forward directionality leading to a splattering deposition). The short pulses enable heating of the material to just above the heating temperature but below the vaporization temperature. For example, for aluminum, a temperature of about 900 to 1000 degrees Celsius is desirable.

In an embodiment, through the use of a laser pulse, an amount of material (e.g., metal) is transferred from the donor structure 208 to the substrate 17 in the form of 100-1000 nm droplets. In an embodiment, the donor material comprises or consists essentially of a metal. In an embodiment, the metal is aluminum. In an embodiment, the material layer 204 is in the form a film. In an embodiment, the film is attached to another body or layer. As discussed above, the body or layer may be a glass.

In an embodiment, the programmable patterning device comprises one or more self-emissive contrast elements that benefit from being driven substantially constantly during an exposure process. In an embodiment, the self-emissive contrast element may comprise a laser diode. A laser diode starts lasing above a certain threshold current. The threshold current may be about 1 to 2% of maximum current, for example. Below the threshold current the laser diode acts like an LED or is off. In an embodiment the laser diode is maintained above the threshold current in order to avoid a timing error associated with the stochastic starting of the laser mode. Such a timing error can be of the order of 200 ps or greater, which could lead to a spot position error of 20 nm or greater.

Maintaining a laser diode above the threshold current may avoid a timing error but means that the laser diode contributes to a background exposure. Where the laser diode contributes in a non-uniform manner to the dose distribution formed on the substrate, the background exposure will also be non-uniform. A non-uniform background level can be difficult to correct for and can have a detrimental effect on image quality.

Additionally, it is expected that rapid switching of the output power of a laser diode will have a negative effect on the lifetime of that laser diode. Reducing the lifetime of a laser diode increases the frequency with which the laser diode may need to be replaced, increasing expense and inconvenience.

Either or both of the above mentioned problems, for example, may be addressed by providing a novel radiation modulator comprising a plurality of waveguides and a modulating section.

In an embodiment, the radiation modulator removes or reduces the background exposure level resulting from driving of a laser diode substantially constantly above a threshold current during the exposure process. The negative impact from increased and/or non-uniform background exposure due to constant driving of a laser diode may thereby be reduced.

In an embodiment, the radiation modulator fully or predominantly defines the intensities of a plurality of radiation beams that form a desired dose pattern on the substrate. In such an embodiment, the radiation source (e.g. one or more self-emissive contrast devices such as one or more laser diodes) may be maintained at a substantially constant output level, thus increasing the average lifetime of the source or elements of the source. In an embodiment, a radiation source and the radiation modulator are used simultaneously to modulate the plurality of radiation beams to be projected. In such an embodiment, the extent to which the output power of the radiation source needs to be varied is reduced in comparison to the case where the radiation modulator is not present. This reduction in the degree of variation in the source output may tend to increase average lifetime.

Figure 6:
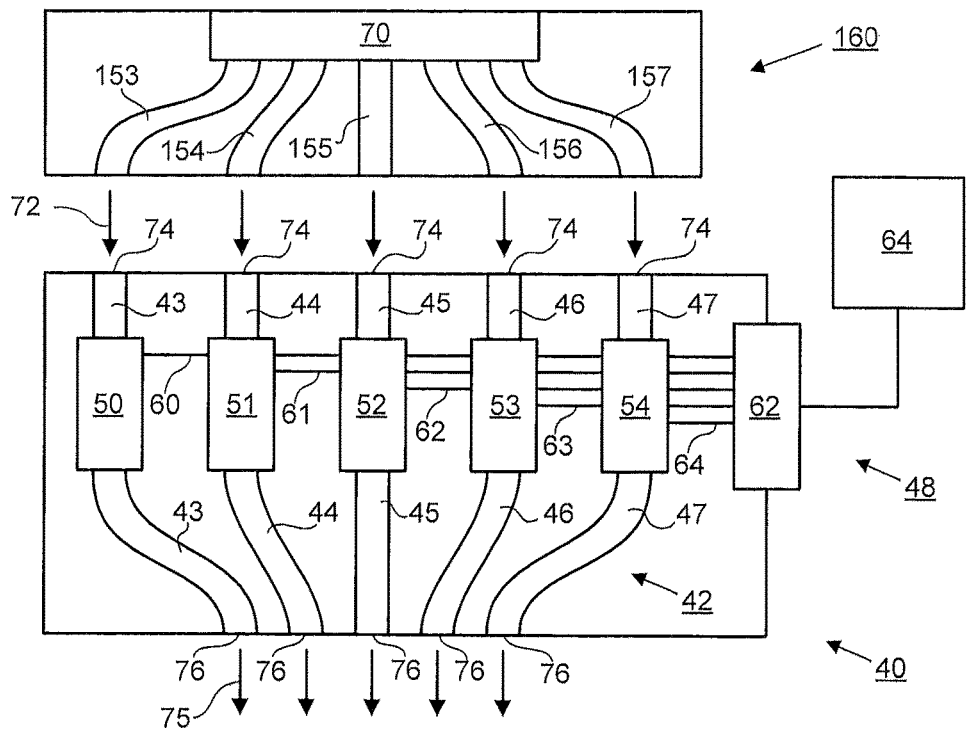
FIG. 6 depicts a radiation modulator configured to receive radiation from a single source according to an embodiment.

In an embodiment, radiation is supplied to the radiation modulator by one or more self-emissive contrast devices. In the discussion above, reference has been made to a laser diode. A laser diode is an example of a type of self-emissive contrast device. Other types of self-emissive contrast devices may be used additionally or alternatively. As discussed above, the radiation modulator is configured to modulate radiation passing through the radiation modulator. This functionality reduces or removes the requirement for the self-emissive contrast device to vary its output power. In an embodiment, this feature is exploited to provide a radiation modulator with input from a number of self-emissive contrast devices that is smaller than the number of individually controllable radiation beams that the radiation modulator is capable of outputting. In this way, the total number of self-emissive contrast devices used in the lithography apparatus may be reduced. The cost and complexity of running the lithography apparatus may therefore be reduced. FIG. 6 depicts an embodiment of such a radiation modulator 40.

The radiation modulator 40 of FIG. 6 comprises a plurality of waveguides 43-47 and a modulating section 48. Each of the plurality of waveguides 43-47 is configured to support propagation of radiation having a wavelength that is suitable for lithography. In an embodiment, the plurality of waveguides are capable of supporting propagation of radiation having a wavelength less than 450 nm. In an embodiment, the plurality of waveguides are configured to support propagation of radiation having a wavelength of about 405 nm. The modulating section 48 is configured to individually modulate radiation propagating in each of the waveguides 43-47. By individually modulating the radiation in each of the waveguides, the modulating section 48 provides a modulated plurality of output beams 75.

In the embodiment shown, the modulating section 48 comprises a plurality of individual modulators 50-54. Each of the individual modulators 50-54 is associated with one of the waveguides 43-47. The modulating section 48 comprises a connection interface 62 configured to provide a connection between a controller 64 and each of the modulators 50-54. Connection lines 60-64 show schematically how control signals can be distributed to each of the modulators 50-54 via the interface 62 from the controller 64. In an embodiment, the controller 64 is configured to provide control signals that are suitable to remove or reduce a background exposure level associated with driving laser diodes substantially constantly above a lasing threshold. In an embodiment, the controller 64 is configured to provide control signals that are suitable to define a complete dose pattern to be formed on a substrate.

In the arrangement of FIG. 6, a single radiation source 70 provides input radiation 72 to all of the inputs 74 to the waveguides 43-47. The modulated beams 75 output from the radiation modulator 40 at the waveguide outputs 76 is therefore modulated exclusively by the modulating section 48. In this embodiment, the input radiation is identical for all of the waveguides 43-47 in the modulator 40. This arrangement reduces or removes the requirement for the source 70 to vary in output power. Various schemes are possible for providing radiation from a single source to each of the inputs 74 with low or minimum loss. In the example shown, a radiation distribution device 160 is provided. The radiation distribution device distributes radiation generated from the single radiation source 70 to each of the waveguides 43-47. In the example shown, the radiation distribution device 160 comprises a plurality of waveguides 153-157 configured to guide the radiation to the waveguides 43-47 of the radiation modulator 40.

Figure 7:
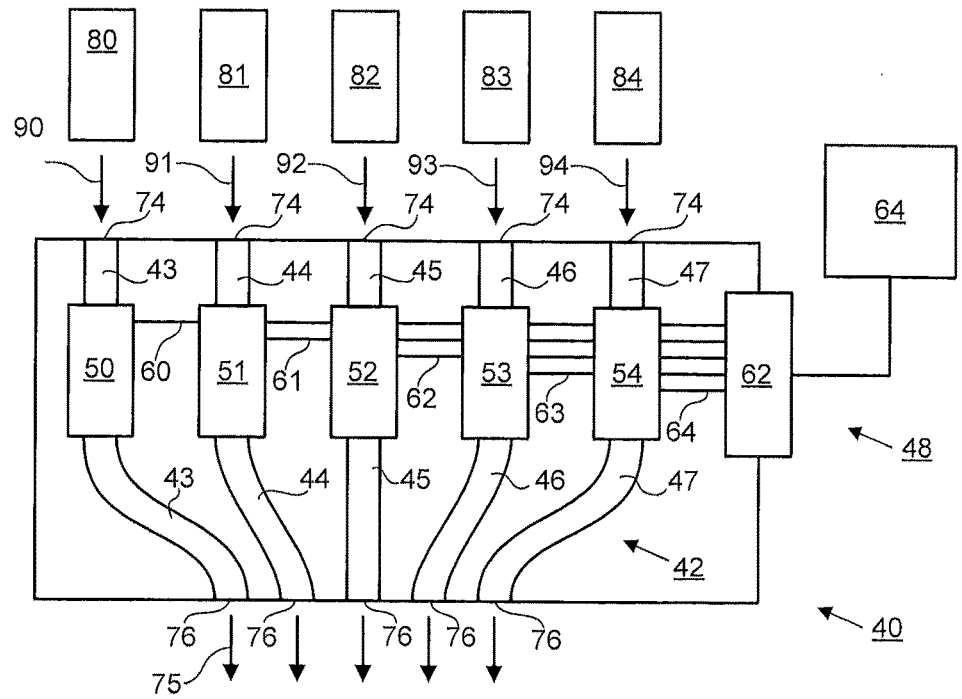
FIG. 7 depicts a radiation modulator configured to receive radiation from a plurality of separate sources according to an embodiment.

FIG. 7 illustrates a configuration in which separate radiation sources 80-84 are provided for each of the waveguides 43-47. In an example of such an embodiment, the radiation beams 90-94 output from the sources 80-84 are produced independently. In an embodiment, such independently produced radiation beams are individually modulated. In other embodiments, the output from the radiation sources 80-84 is arranged to be nominally identical (any small variations can be compensated by calibration). The provision of separate radiation sources 80-84 may facilitate high output power at reasonable cost. For example, laser diodes operating in the region of 405 nm are widely available commercially for use in other applications.

FIG. 6 depicts a radiation modulator 40 configured to receive radiation from single radiation source 70. The single radiation source 70 provides input to all of the plurality of waveguides 43-47 of the modulator 40. FIG. 7 depicts an arrangement in which a separate radiation source is provided for each one of the plurality of waveguides 43-47 of the modulator 40. Intermediate arrangements are possible, where a plurality of radiation sources are provided for a given modulator, but in which the number of radiation sources is less than the number of waveguides in the modulator. In an example, the number of radiation sources is equal to half the number of waveguides in the modulator. In another example, the number of radiation sources is equal to a third of the number of waveguides in the modulator.

In an embodiment, the plurality of waveguides of the modulator are configured to converge spatially. The spatial convergence allows the average separation of the outputs 76 from the waveguides 43-47 to be smaller than the average separation between the inputs 74. FIGS. 6 and 7 both show example configurations in which the waveguides are configured to converge spatially. In the examples shown, the waveguides 43-47 are shown converging in the portion of the optical path after the modulators 50-54. In an embodiment, the waveguides 43-47 converge spatially in the optical path before the modulators 50-54 instead of, or in addition to, converging spatially in the optical path after the modulators 50-54. Using the radiation modulator 40 to bring the output beams 75 closer together spatially reduces the magnification demands on the optical system that receives the output beams 75 and projects the output beams 75 onto the substrate. Manufacturing tolerance, expense and space requirements associated with the optical system may thereby be reduced. In the case where separate radiation sources are provided in the manner shown in FIG. 7, the spatial convergence may assist with providing adequate clearance between neighboring radiation sources, for example to prevent overheating and/or assisting with efficient replacement of failed radiation source units.

In an embodiment, each of the modulators 50-54 is positioned on an optical path between the input 74 and the output 76 of one of the waveguides 43-47. In an embodiment, each of the modulators is capable of providing switching speeds of 600 MHz or greater, optionally 1000 MHz or greater, or optionally 2000 MHz or greater.

In an embodiment, the modulator 50-54 is a refractive modulator. In a refractive modulator, the refractive index of the material of the waveguide is changed. Changing the refractive index of the waveguide material changes the effective optical path length within the material. Where the optical path length is changed anisotropically, the polarization of the radiation in the waveguide can be modulated. Where the waveguide splits into a plurality of separate branches which are later recombined, changing the refractive index in one of the branches can be used to modify the way in which radiation in that branch will interfere with radiation from other branches when the branches recombine. Changing the refractive index in a branch effectively modifies the phase of radiation in that branch relative to radiation in other branches. For example, the optical path length in the branch can be adapted so as to cause destructive interference on recombination. In this way, the output from the waveguide can be "switched off". In an embodiment, the optical path length can be modified to cause constructive interference to provide a maximum output from the waveguide. Intermediate levels of interference can be used to generate intermediate output intensities.

In an embodiment, the refractive modulator is configured to utilize the electro-optic effect. Alternatively or additionally, the modulator is configured to utilize an acousto-optic effect. Alternatively or additionally, the modulator is configured to utilize a magneto-optic effect. In an embodiment, the magneto-optic effect comprises the Faraday effect and/or the Cotton-Mouton effect. Alternatively or additionally, the modulator is configured to utilize a polarization change in a liquid crystal.

In an embodiment, the waveguide material of the refractive modulator comprises one or more selected from the following: doped $SiO_2$, Nd—$SiO_2$, $LiNbO_3$, periodically-poled ferroelectric crystal, periodically poled potassium titanyl phosphate, photonic crystal, an III-V compound, and/or $TeO_2$. An III-V compound is not generally very transparent to UV radiation but the required path length is relatively small. In an embodiment, $TeO_2$ is used to implement an acousto-optic effect in the refractive modulator.

Figure 8:
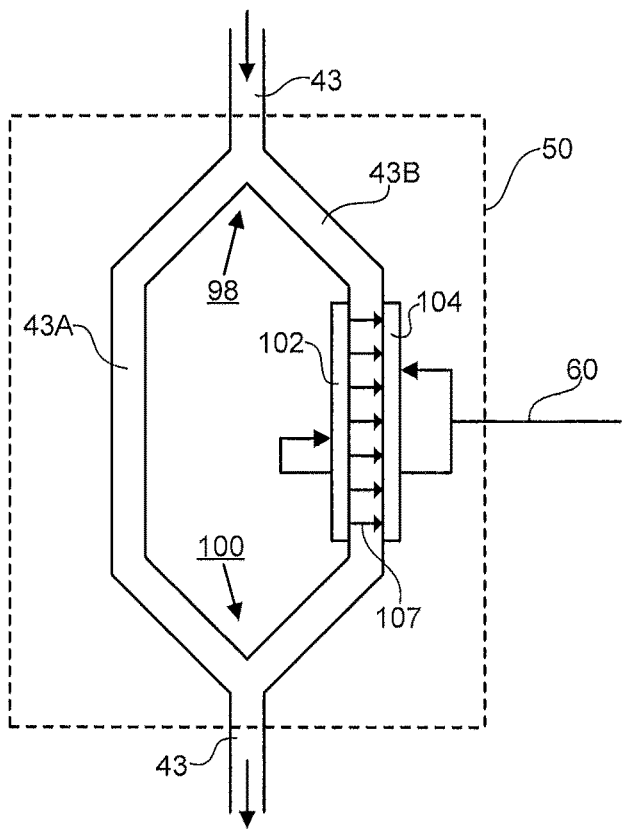
FIG. 8 depicts a modulating section comprising a refractive modulator according to an embodiment.

FIG. 8 is a schematic illustration of a refractive modulator 50 according to an embodiment. The modulator 50 is configured to modulate the amplitude of radiation propagating in a waveguide 43. In the region of the modulator 50, the waveguide 43 splits at a first junction 98 into a first branch 43A and a second branch 43B. The first and second branches recombine at a second junction 100. In the embodiment shown, the lengths of the first and second branches are the same. In the absence of modulation, radiation will interfere constructively at the second junction 100. In other embodiments, the lengths of the first and second branches may be configured otherwise, for example to achieve different types of "default" interference at the second junction 100 (e.g. destructive interference).

In the embodiment shown, the modulator 50 comprises contact elements 102 and 104 that are configured to apply an electric field 107 across a portion of the second branch 43B of the waveguide. In an embodiment, the contact elements 102,104 are configured to operate in the manner of a capacitor plate. The size and/or direction of the electric field 107 is set by the input signal 60. The material of the waveguide 43 is selected so that the optical path length of the second branch 43B can be changed sufficiently without the need for an excessively large electric field. In an embodiment, the material and/or waveguide dimensions are chosen such that the appropriate electric field can be generated using a potential difference between the contact elements of less than or equal to 10 V, optionally less than or equal to 5 V, or optionally less than or equal to 1 V. In an embodiment, the modulation can be performed continuously between complete destructive interference and complete constructive interference according to the input signal 60.

Figure 9:
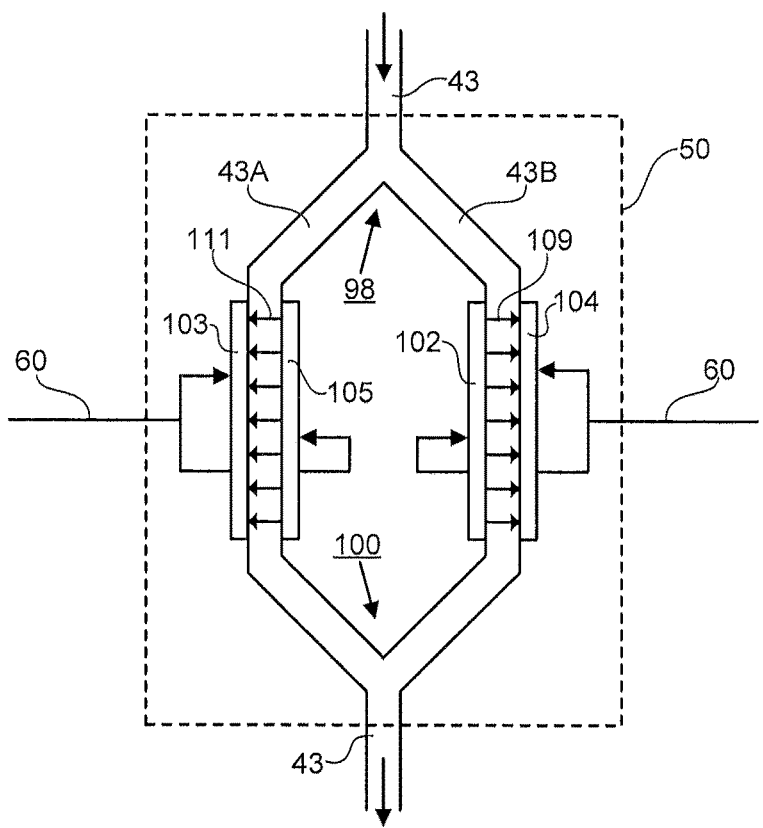
FIG. 9 depicts a modulating section comprising a refractive modulator according to an embodiment.

FIG. 9 depicts an embodiment in which the phase can be changed in both of the branches 43A and 43B. Such a configuration can operate in a so-called "push-pull" mode where the phase is changed in opposite senses in the two branches. In comparison with an embodiment, such as that shown in FIG. 8, where the phase is only changed in one branch, the "push-pull" arrangement can achieve the same phase difference between the recombining radiation with a voltage that is half as large. In the particular example shown, two pairs of contact elements are provided: contact elements 102 and 104 in branch 43B and contact elements 103 and 105 in branch 43A. In a push-pull configuration, contact elements 102 and 104 are configured to produce an electric field 109 in branch 43B that is substantially equal in size and opposite in magnitude to the electric field 111 produced in branch 43A by contact elements 103 and 105. For a given phase difference between the radiation beams recombining at the junction 100, the electric fields (and thus driving voltages) 109 and 111 need only be half the size of the electric field 107 required in the embodiment of FIG. 8. Lowering the voltage may facilitate efficient driving of the modulators at high speed and/or high power.

Figure 10:
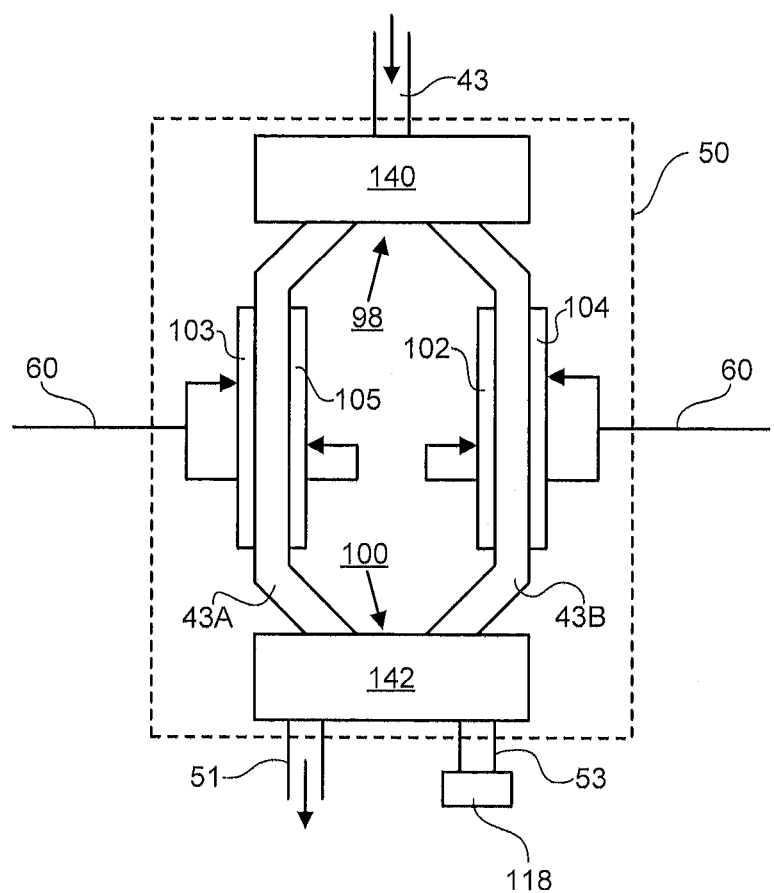
FIG. 10 depicts a modulating section comprising a refractive modulator according to an embodiment.

FIG. 10 depicts an embodiment in which the modulator 50 comprises two outputs 51 and 53 (rather than one output 43 as in the embodiments of FIGS. 8 and 9). In other embodiments, more than two outputs may be provided. In the embodiment shown, the modulator 50 is configured to modify the phase of one or both of the channels 43A,43B to control how radiation power is distributed (i.e. shared) between the outputs 51,53. In an embodiment, the modulation is performed so as to selectively direct all of the radiation to one of the outputs 51,53 and not to the other. In an embodiment, the modulation is performed so as to direct a portion of the radiation to one output with the rest of the radiation being directed to the other output.

In the embodiment shown in FIG. 10, output 51 is configured to carry radiation that has been selected for projection onto the substrate, Output 53 is configured to dispose of radiation that has been rejected. In an embodiment, output 53 is configured to carry radiation to a radiation dump 118. The radiation dump 118 may be configured to handle the radiation in a manner which reduces or minimizes negative impact on the lithography apparatus. For example, the radiation dump 118 may be thermally isolated from one or more heat sensitive components of the lithography apparatus. The radiation dump 118 may be configured to be in good thermal contact with the environment outside of the lithography apparatus so as to transport heat efficiently away from the lithography apparatus.

In comparison to an embodiment of the type shown in FIGS. 8 and 9, an embodiment of the type shown in FIG. 10 may facilitate avoidance of modulator heating caused by absorption of "rejected" radiation. In an embodiment of the type shown in FIGS. 8 and 9, destructive interference between recombining radiation beams may cause localized heating, for example in cladding applied to the waveguides. Providing an output that can channel rejected radiation away from the modulator may reduce such localized heating. Localized heating of the modulator could contribute to premature failure and/or negatively affect the accuracy of the modulation by changing an optical property of the waveguide material (and hence the phase of radiation propagating therein).

In an embodiment of the type shown in FIG. 10, the splitting and/or recombination of the radiation beams is implemented using a multi-mode interference (MMI) device. MMIs can be simpler to implement and more robust that "Y" couplers of the type illustrated in FIGS. 8 and 9. In an embodiment, a first 2×2 MMI 140 is provided to split the input beam and a second 2×2 MMI 142 is provided to recombine the beams and selectively direct radiation into either or both of the two outputs 51 and 53. In such an embodiment, each 2×2 MMI has two inputs and two outputs. In an embodiment, input radiation beam is applied to one of the two inputs to the MMI 140. The two outputs of the MMI 140 are connected respectively to the two branches 43A and 43B. The two branches 43A and 43B are connected to the two inputs of the MMI 142. The two outputs of the MMI 142 are connected to outputs 51 and 53. By varying the phase difference between radiation in the two branches 43A and 43B it is possible to redirect radiation entirely into the output 51, entirely into the output 53, or to split the radiation in any proportion between the two outputs 51 and 53.

In an embodiment where amplitude/intensity modulation is desired, the amplitude/intensity modulation may be performed partly or entirely within the waveguides 43-47. Alternatively or additionally, the amplitude/intensity modulation may be performed partly outside of the waveguides 43-47, downstream from the radiation modulator 40. In an embodiment, the radiation modulator 40 is configured to modulate the polarization of the radiation, for example, which allows energy to be removed from the beams at a later stage using a polarization dependent beam splitter.

Figure 11:
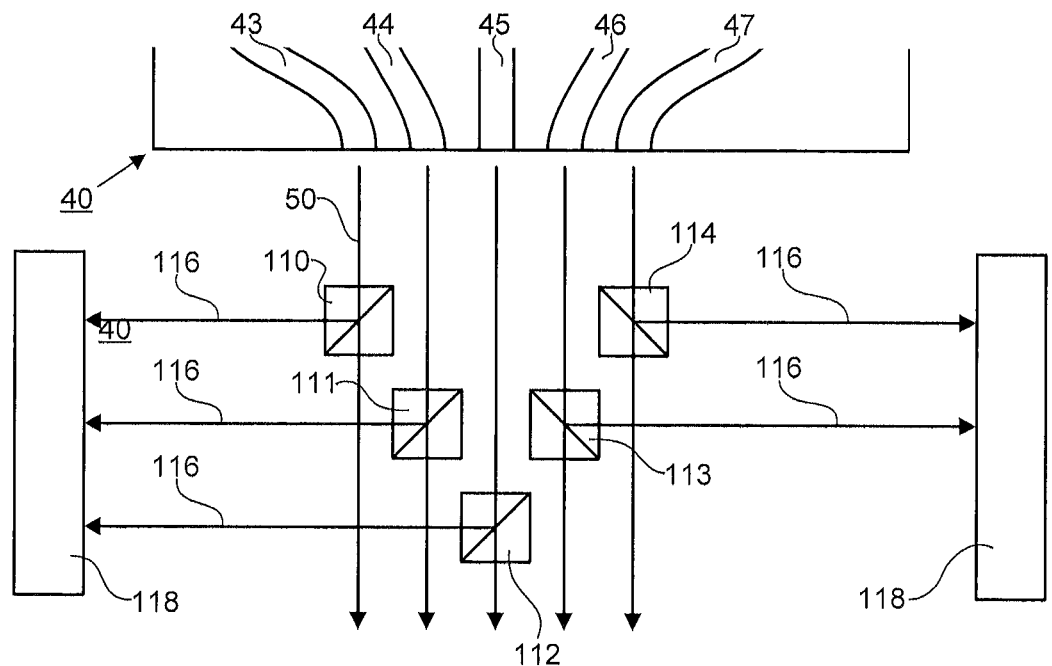
FIG. 11 depicts an arrangement configured to split beams output from a radiation modulator according to the state of polarization of the beams according to an embodiment.
Figure 12:
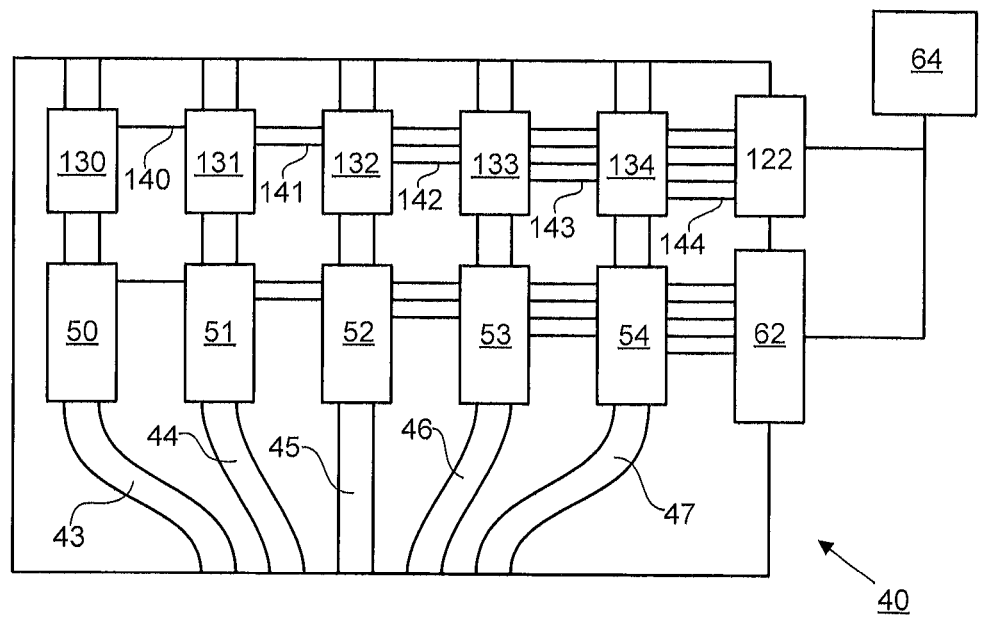
FIG. 12 depicts a radiation modulator comprising a plurality of modulating sections and lasing modules according to an embodiment.

FIG. 11 illustrates an embodiment in which output beams 75 from the radiation modulator 40 have modulated polarizations. In this example, the radiation modulator 40 is configured to direct the output beams 75 through polarization dependent beam splitters 110-114. The polarization dependent beams splitters 110-114 are configured to redirect all or a portion of input radiation according to the state of polarization of that beam. The redirected radiation 116 may be directed to a radiation dump 118.

In the embodiment of FIG. 11, the radiation modulator 40 is configured only to modulate the polarization of radiation propagating in the waveguides 43-47. The radiation is removed from each of the radiation beams at a later stage. In an embodiment, the radiation modulator 40 itself is configured to selectively redirect radiation according to the state of polarization of the radiation. In an embodiment, the redirected radiation is configured to leave the radiation modulator 40 and be absorbed by a radiation dump that is outside the radiation modulator 40. In such an embodiment, heat associated with absorption of redirected radiation will not cause significant heating of the radiation modulator 40. In an embodiment, the radiation modulator 40 comprises a radiation dump configured to absorb redirected radiation. In such an embodiment, the radiation dump may be configured so that heat can flow efficiently away from the radiation dump so that absorption of radiation does not cause a significant change in temperature of the radiation modulator 40.

In the embodiments discussed above, the radiation source 70, 80-84 is provided separately from the radiation modulator 40. In an embodiment, part, or all, of the radiation source is integrated with the radiation modulator 40. In an embodiment, part, or all, of the radiation source is configured to interact directly with the waveguides 43-47 and/or have an element forming part of the waveguides 43-47 or located within the waveguides 43-47.

FIG. 11 illustrates an embodiment of this type. In this example, the radiation modulator 40 comprises waveguides 43-47 having modulators 50-54 of the type described above with reference to FIGS. 6 and 7. In addition, each of the waveguides 43-47 has a module 130-134 that can increase an intensity of radiation propagating within the waveguide. In an embodiment, the module 130-134 comprises an optically active material that allows amplification of radiation by an amount determined by the size of an input signal from controller 64 via interface 122. In an embodiment of this type, the connections 140-144 provide both signals to determine the level of gain and the driving power for the amplifiers of the modules 130-134. In an embodiment, the modules 130-134 comprise one or more integrated laser diodes that are configured to generate a laser output in the waveguide itself.

In an embodiment, each of the modulators 50-54 comprises an absorptive modulator. The absorptive modulator is configured to modulate the output from the waveguides 43-47 by selectively varying a level of radiation absorption in the waveguide 43-47. In an embodiment, the absorptive modulator is configured to exploit one or more of the following effects: Franz-Keldysh effect, quantum-confined Stark effect, excitonic absorption, changes of Fermi level, changes of free carrier concentration, acousto-optic effect (for example by diffracting part of the radiation into the cladding where it is absorbed), and/or electro-chromic effect.

In accordance with a device manufacturing method, a device, such as a display, integrated circuit or any other item may be manufactured from the substrate on which the pattern has been projected.

Embodiments are provided in accordance with the following number clauses:

1. A radiation modulator for a lithography apparatus, the radiation modulator comprising: a plurality of waveguides supporting propagation therethough of radiation having a wavelength less than 450 nm; and a modulating section configured to individually modulate radiation propagating in each of the waveguides in order to provide a modulated plurality of output beams 2. The modulator according to clause 1, wherein each of the plurality of waveguides comprises an input and an output, the input configured to receive radiation from a radiation source and the output configured to output radiation after modulation by the modulating section.

3. The modulator according to clause 2, wherein at least two of the inputs are configured to receive radiation from the same radiation source and provide output radiation to separate outputs.

4. The modulator according to clause 2 or clause 3, wherein at least two of the inputs are configured to receive radiation from different radiation sources.

5. The modulator according to any of the preceding clauses, wherein the plurality of waveguides are configured to converge spatially so as to provide a plurality of output beams having an average separation that is smaller than the average separation of the inputs.

6. The modulator according to any of clauses 2-5, wherein a refractive modulator is positioned on an optical path between the input and output of one or more of the waveguides.

7. The modulator according to clause 6, wherein the refractive modulator comprises an electro-optical modulator.

8. The modulator according to clause 6 or clause 7, wherein the waveguide material of the refractive modulator comprises one or more selected from the following: doped $SiO_2$, Nd—$SiO_2$, $LiNbO_3$, periodically-poled ferroelectric crystal, periodically poled potassium titanyl phosphate, photonic crystal, an III-V compound, and/or $TeO_2$.

9. The modulator according to any of clauses 6-8, wherein the refractive modulator comprises an acousto-optic modulator.

10. The modulator according to any of clauses 6-9, wherein the refractive modulator comprises a magneto-optic modulator.

11. The modulator according to any of clauses 6-10, wherein the refractive modulator is configured to split an input beam into a plurality of beams, refractively modulate the phase of one or more of the plurality of beams in order to change the phase thereof, and recombine the beams to cause interference between the beams.

12. The modulator according to clause 11, wherein: the refractive modulator comprises two or more outputs for the recombining beams; and the phase of one or more of the plurality of beams is modulated to control a distribution of radiation power between the two or more outputs.

13. The modulator according to clause 12, wherein the refractive modulator comprises two outputs and the control of the distribution of radiation power comprises selectively directing radiation into one of the two outputs and not the other, or selectively directing a proportion of the radiation into one of the two outputs and the rest into the other.

14. The modulator according to clause 13, wherein one of the two outputs is directed to a radiation dump.

15. The modulator according to any of clauses 11-14, wherein two of the beams are modulated so as to change the phase in each beam in opposite senses before recombination.

16. The modulator according to any of clauses 2-5, wherein an absorptive modulator is positioned in an optical path between the input and output of one or more of the waveguides.

17. The modulator according to clause 16, wherein the absorptive modulator is configured to exploit one or more of the following effects: Franz-Keldysh effect, quantum-confined Stark effect, excitonic absorption, changes of Fermi level, changes of free carrier concentration, acousto-optic effect, and/or electro-chromic effect.

18. The modulator according to any of clauses 2-17, wherein a polarization modulator that is configured to alter the state of polarization of radiation is positioned in an optical path between the input and output of one or more of the waveguides.

19. The modulator according to clause 18, wherein the waveguide assembly comprises a polarization dependent beam splitter configured selectively to re-direct radiation as a function of the polarization of the radiation.

20. The modulator according to clause 18 or clause 19, wherein the polarization modulator comprises a refractive modulator.

21. The modulator according to any of the preceding clauses, wherein the modulating section is configured to modulate the amplitude or intensity of one or more radiation beams output from the waveguides.

22. The modulator according to any of the preceding clauses, wherein the modulating section is configured to modulate a polarization of radiation output from one or more of the waveguides.

23. The modulator according to any of the preceding clauses, wherein one or more of the waveguides comprises optically active material configured to allow radiation amplification in the waveguide, and the modulating section is configured to interact with the optically active material to determine an amount by which to amplify the radiation, in order to modulate the radiation in the waveguide.

24. The modulator according to any of the preceding clauses, wherein one or more of the waveguides comprises an integrated laser diode, the modulating section configured to interact directly with the integrated laser diode and/or with a portion of the waveguide downstream from the laser diode, in order to modulate the radiation in the waveguide.

25. A lithography apparatus, comprising: a programmable patterning device configured to provide a plurality of individually controllable radiation beams, the programmable patterning device comprising a radiation modulator, the radiation modulator comprising a plurality of waveguides and a modulating section configured to individually modulate radiation propagating in each of the waveguides in order to provide the plurality of individually controllable radiation beams; and a projection system configured to project each of the radiation beams onto a respective location on a target.

26. The lithography apparatus according to clause 25, wherein the plurality of waveguides are configured to support propagation therethrough of radiation having a wavelength less than 450 nm.

27. The lithography apparatus according to clause 25 or clause 26, wherein the programmable patterning device further comprises a plurality of self-emissive contrast devices configured to input radiation to the radiation modulator.

28. The lithography apparatus according to clause 27, wherein the plurality of self-emissive contrast devices comprise a plurality of laser diodes.

29. The lithography apparatus according to clause 28, configured to maintain the plurality of laser diodes above a lasing threshold during use.

30. The lithography apparatus according to clause 29, further configured to use the modulating section to remove or homogenize a background exposure level on the target associated with driving the laser diodes at the lasing threshold.

31. The lithography apparatus according to any of clauses 25-30, wherein: the modulating section is configured to modulate a polarization of radiation output from one or more of the waveguides; and the apparatus further comprises: a polarization dependent beam splitter configured to selectively re-direct radiation as a function of the polarization of the radiation; and a radiation dump configured to receive radiation output by the beam splitter in at least one available output path from the beam splitter.

32. The lithography apparatus according to any of clauses 25-31, further comprising a radiation distribution device configured to distribute radiation generated by a single radiation source to more than one of the plurality of waveguides of the radiation modulator.

33. The lithography apparatus according to clause 32, wherein the radiation distribution device comprises a plurality of waveguides.

34. A method of modulating radiation for use in lithography, the method comprising: providing a plurality of waveguides for supporting propagation therethrough of radiation having a wavelength less than 450 nm; and individually modulating radiation in each of the waveguides in order to provide a modulated plurality of output beams.

35. A device manufacturing method, comprising: providing a plurality of waveguides; individually modulating radiation propagating in each of the waveguides in order to provide a plurality of individually controllable radiation beams; and projecting each of the radiation beams onto a respective location on a target.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The term "lens", where the context allows, may refer to any one of various types of optical components, including refractive, diffractive, reflective, magnetic, electromagnetic and electrostatic optical components or combinations thereof.

The descriptions above are intended to be illustrative, not limiting. Thus, it will be apparent to one skilled in the art that modifications may be made to the invention as described without departing from the scope of the claims set out below.

The invention claimed is:

1. A radiation modulator for a lithography apparatus, the radiation modulator comprising:
   a plurality of waveguides supporting propagation therethough of radiation having a wavelength less than 450 nm, wherein the modulator is configured such that each waveguide of the plurality of waveguides is dedicated to a different radiation source of a plurality of radiation sources;
   a modulating section configured to receive radiation from the inputs of the plurality of waveguides and to individually modulate radiation from the respective inputs prior to propagation of the modulated radiation toward outputs of the waveguides in order to provide a modulated plurality of output beams; and
   a control system configured to cause at least one of the radiation sources to modulate its radiation output and to control modulation, by the modulating section, of radiation from the inputs of the plurality of waveguides.

2. The modulator according to claim 1, wherein the plurality of waveguides are configured to converge spatially so as to provide a plurality of output beams having an average separation that is smaller than the average separation of the inputs of the waveguides.

3. A lithography apparatus, comprising:
   a programmable patterning device configured to provide a plurality of individually controllable radiation beams, the programmable patterning device comprising a radiation modulator, the radiation modulator comprising:
   a plurality of waveguides supporting propagation therethough of radiation, wherein the radiation modulator is configured such that each waveguide of the plurality of waveguides is dedicated to a different radiation source of a plurality of radiation sources, and
   a modulating section configured to receive radiation from the inputs of the plurality of waveguides and to individually modulate radiation from the respective inputs prior to propagation of the modulated radiation toward outputs of the waveguides in order to provide the plurality of individually controllable radiation beams; and
   a projection system configured to project each of the radiation beams onto a respective location on a target.

4. The lithography apparatus according to claim 3, wherein at least two of the inputs are configured to receive radiation from a same radiation source and provide output radiation to separate outputs.

5. The lithography apparatus according to claim 3, wherein a refractive modulator is positioned on an optical path between the input and output of one or more of the waveguides.

6. The lithography apparatus according to claim 5, wherein the refractive modulator is configured to split an input beam into a plurality of beams, refractively modulate the phase of one or more of the plurality of beams in order to change the phase thereof, and recombine the beams to cause interference between the beams.

7. The lithography apparatus according to claim 6, wherein:
   the refractive modulator comprises two or more outputs for the recombining beams; and
   the phase of one or more of the plurality of beams is modulated to control a distribution of radiation power between the two or more outputs.

8. The lithography apparatus according to claim 7, wherein the refractive modulator comprises two outputs and the control of the distribution of radiation power comprises selectively directing radiation into one of the two outputs and not the other, or selectively directing a proportion of the radiation into one of the two outputs and the rest into the other.

9. The lithography apparatus according to claim 6, wherein two of the beams are modulated so as to change the phase in each beam in opposite senses before recombination.

10. The lithography apparatus according to claim 3, wherein an absorptive modulator is positioned in an optical path between the input and output of one or more of the waveguides for exploiting one or more of the following effects: Franz-Keldysh effect, quantum-confined Stark effect, excitonic absorption, changes of Fermi level, changes of free carrier concentration, acousto-optic effect, and/or electro-chromic effect.

11. The lithography apparatus according to claim 3, wherein a polarization modulator that is configured to alter the state of polarization of radiation is positioned in an optical path between the input and output of one or more of the waveguides.

12. The lithography apparatus according to claim 11, further comprising a polarization dependent beam splitter configured selectively to re-direct radiation as a function of the polarization of the radiation.

13. The lithography apparatus according to claim 3, wherein the modulating section is configured to modulate the amplitude or intensity of one or more radiation beams output from the waveguides.

14. The lithography apparatus according to claim 3, wherein the modulating section is configured to modulate a polarization of radiation output from one or more of the waveguides.

15. The lithography apparatus according to claim 3, wherein the programmable patterning device further comprises a plurality of self-emissive contrast devices as the plurality of radiation sources, the plurality of self-emissive contrast devices configured to input radiation to the radiation modulator.

16. The lithography apparatus according to claim 3, wherein:
   the modulating section is configured to modulate a polarization of radiation output from one or more of the waveguides; and
   the apparatus further comprises:
   a polarization dependent beam splitter configured to selectively re-direct radiation as a function of the polarization of the radiation; and a radiation dump configured to receive radiation output by the beam splitter in at least one available output path from the beam splitter.

17. The lithography apparatus according to claim 3, further comprising a radiation distribution device configured to distribute radiation generated by a single radiation source to more than one of the plurality of waveguides of the radiation modulator.

18. The apparatus according to claim 3, wherein the plurality of waveguides are configured to converge spatially so as to provide a plurality of output beams having an average separation that is smaller than the average separation of the inputs of the waveguides.

19. The apparatus according to claim 3, comprising a control system configured to cause at least one of the radiation sources to modulate its radiation output and to control modulation, by the modulating section, of radiation from the inputs of the plurality of waveguides.

20. A method of modulating radiation for use in lithography, the method comprising:
   providing a plurality of waveguides for supporting propagation therethrough of radiation having a wavelength less than 450 nm;
   causing at least one radiation source of a plurality of radiation sources to modulate its radiation output;
   providing radiation to the input of each waveguide from the plurality of radiation sources, wherein each waveguide of the plurality of waveguides is dedicated to a different radiation source of the plurality of radiation sources;
   receiving radiation to a modulator from the inputs of the plurality of waveguides; and
   individually modulating, by the modulator, radiation from the respective inputs prior to propagation of the modulated radiation toward outputs of the waveguides in order to provide a modulated plurality of output beams.

21. A device manufacturing method, comprising:
   providing a plurality of waveguides;
   causing at least one radiation source of a plurality of radiation sources to modulate its radiation output;
   providing radiation to the input of each waveguide from the plurality of radiation sources, wherein each waveguide of the plurality of waveguides is dedicated to a different radiation source of the plurality of radiation sources;
   receiving radiation to a modulator from the inputs of the plurality of waveguides;
   individually modulating, by the modulator, radiation from the respective inputs prior to propagation of the modulated radiation toward outputs of the waveguides in order to provide a plurality of individually controllable radiation beams; and
   projecting each of the radiation beams onto a respective location on a target.

* * * * *